United States Patent
Shahin et al.

(10) Patent No.: US 10,770,865 B1
(45) Date of Patent: Sep. 8, 2020

(54) MULTI-STRIPE EDGE-EMITTING LASER

(71) Applicant: Microsoft Technology Licensing, LLC, Redmond, WA (US)

(72) Inventors: Shiva Shahin, Seattle, WA (US); Dale Eugene Zimmerman, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/408,916

(22) Filed: May 10, 2019

(51) Int. Cl.
*H01S 5/40* (2006.01)
*H01S 5/10* (2006.01)
*H01S 5/042* (2006.01)
*H01S 5/068* (2006.01)
*H01S 5/22* (2006.01)
*G02B 27/01* (2006.01)

(52) U.S. Cl.
CPC ........ *H01S 5/4031* (2013.01); *G02B 27/0172* (2013.01); *H01S 5/042* (2013.01); *H01S 5/06804* (2013.01); *H01S 5/1039* (2013.01); *H01S 5/22* (2013.01); *H01S 5/4012* (2013.01); *H01S 5/4093* (2013.01); *G02B 2027/0112* (2013.01); *G02B 2027/0178* (2013.01)

(58) Field of Classification Search
CPC ..... H01S 5/4031; H01S 5/1039; H01S 5/4012
See application file for complete search history.

(56) References Cited

U.S. PATENT DOCUMENTS

| | | | |
|---|---|---|---|
| 4,502,762 A * | 3/1985 | Anderson | B23K 26/02 359/484.03 |
| 2005/0105577 A1 * | 5/2005 | Fukuhisa | H01S 5/2231 372/50.1 |

* cited by examiner

*Primary Examiner* — Michael Carter
(74) *Attorney, Agent, or Firm* — Alleman Hall Creasman & Tuttle LLP (57) ABSTRACT

An edge-emitting laser including a substrate, a lower power optical cavity located on the substrate and a higher power optical cavity located on the substrate adjacent the lower power optical cavity. The lower power optical cavity includes a first active gain section having a first length. The higher power optical cavity includes a second active gain section having a second length greater than the first length.

17 Claims, 7 Drawing Sheets

MULTI-STRIPE EDGE-EMITTING LASER

BACKGROUND

Mixed-reality systems, including virtual-reality (VR) and augmented-reality (AR) systems can potentially create truly unique experiences. Conventional VR systems create a completely immersive experience by restricting their users' views to only virtual environments. This is often achieved through the use of a head-mounted device (HMD) that completely blocks any view of the real world. As a result, a user is entirely immersed within the virtual environment. In contrast, conventional AR systems create an augmented-reality experience by visually admixing virtual images within a user's view of the real world.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

An edge-emitting laser including a substrate, a lower power optical cavity located on the substrate and a higher power optical cavity located on the substrate adjacent the lower power optical cavity. The lower power optical cavity includes a first active gain section having a first length. The higher power optical cavity includes a second active gain section having a second length greater than the first length.

DETAILED DESCRIPTION

One limitation of state-of-the-art head mounted displays (HMDs) is the dynamic range (DR) of the display. For an enjoyable user experience, the display image should ideally be indistinguishable from the real world. However, human vision can perceive a much wider range of contrast than the DR afforded by typical HMDs.

Such DR issues may be exacerbated in laser-based HMDs. In such displays, the pixel brightness ranges from close to a laser threshold luminance to its maximum luminance. Generally, most pixels in different images across various applications represent low luminance content that is close to the laser threshold luminance. Having a limited DR in this lower laser power region may make it difficult to accurately represent low luminance content. Furthermore, due to the temperature dependency of a laser threshold current at which the laser lases coherent light, as well as thermal and electrical cross talk between different emitters resulting in an unwanted shift of the threshold, accurate laser power control at lower power is challenging.

Accordingly, the present disclosure is directed to a multi-stripe edge-emitting laser having extended DR. The multi-stripe edge-emitting laser includes a substrate, a lower power optical cavity (e.g., a first stripe) located on the substrate and a higher power optical cavity (e.g., a second stripe) located on the substrate adjacent the lower power optical cavity. The lower power optical cavity includes a first active gain section having a first length. The higher power optical cavity includes a second active gain section having a second length greater than the first length.

The multi-stripe edge-emitting laser may be controlled such that the lower power optical cavity is responsible for lasing light for low luminance display content that is near or below a threshold luminance of the higher power optical cavity. The higher power optical cavity may be controlled to lase light for higher luminance display content, such as display content having a luminance that is higher than the output capability of the lower power optical cavity.

Selectively using either or both of the two stripes for different pixel luminance levels extends DR and reduces sensitivity to threshold current uncertainty, because the power required for lower luminance pixels can be well above the threshold current for the lower power optical cavity, while the higher power optical cavity can achieve relatively high optical power.

Figure 1:
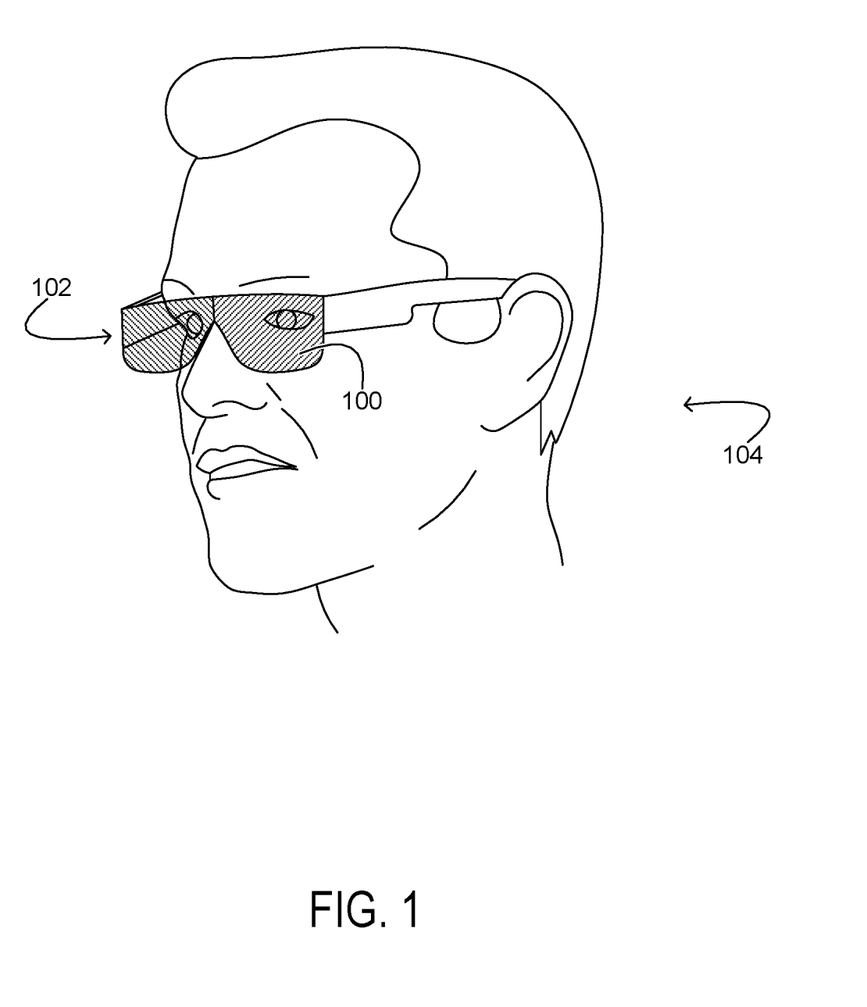
FIG. 1 shows aspects of an example implementation environment for a near-eye display system.

FIG. 1 shows aspects of an example implementation environment for a near-eye display system 100. As illustrated herein, near-eye display system 100 is a component of a head-mounted electronic device 102, which is worn and operated by a user 104. The near-eye display system 100 is configured to present virtual imagery in the user's field of view. In some implementations, user-input componentry of the wearable electronic device 104 may enable the user to interact with the virtual imagery. The wearable electronic device 102 takes the form of eyeglasses in the example of FIG. 1. In other examples, the wearable electronic device 102 may take the form of goggles, a helmet, or a visor. In still other examples, the near-eye display system 100 may be a component of a non-wearable electronic device, such as a heads-up display.

The near-eye display system 100 may be configured to cover one or both eyes of the user 104 and may be adapted for monocular or binocular image display. In examples in which the near-eye display system 100 covers only one eye, but binocular image display is desired, a complementary near-eye display system may be arranged over the other eye. In examples in which the near-eye display system covers both eyes and binocular image display is desired, the virtual imagery presented by near-eye display system 100 may be divided into right and left portions directed to the right and left eyes, respectively. In scenarios in which stereoscopic image display is desired, the virtual imagery from the right and left portions, or complementary near-eye display systems, may be configured with appropriate stereo disparity so as to present a three-dimensional subject or scene.

Figure 2:
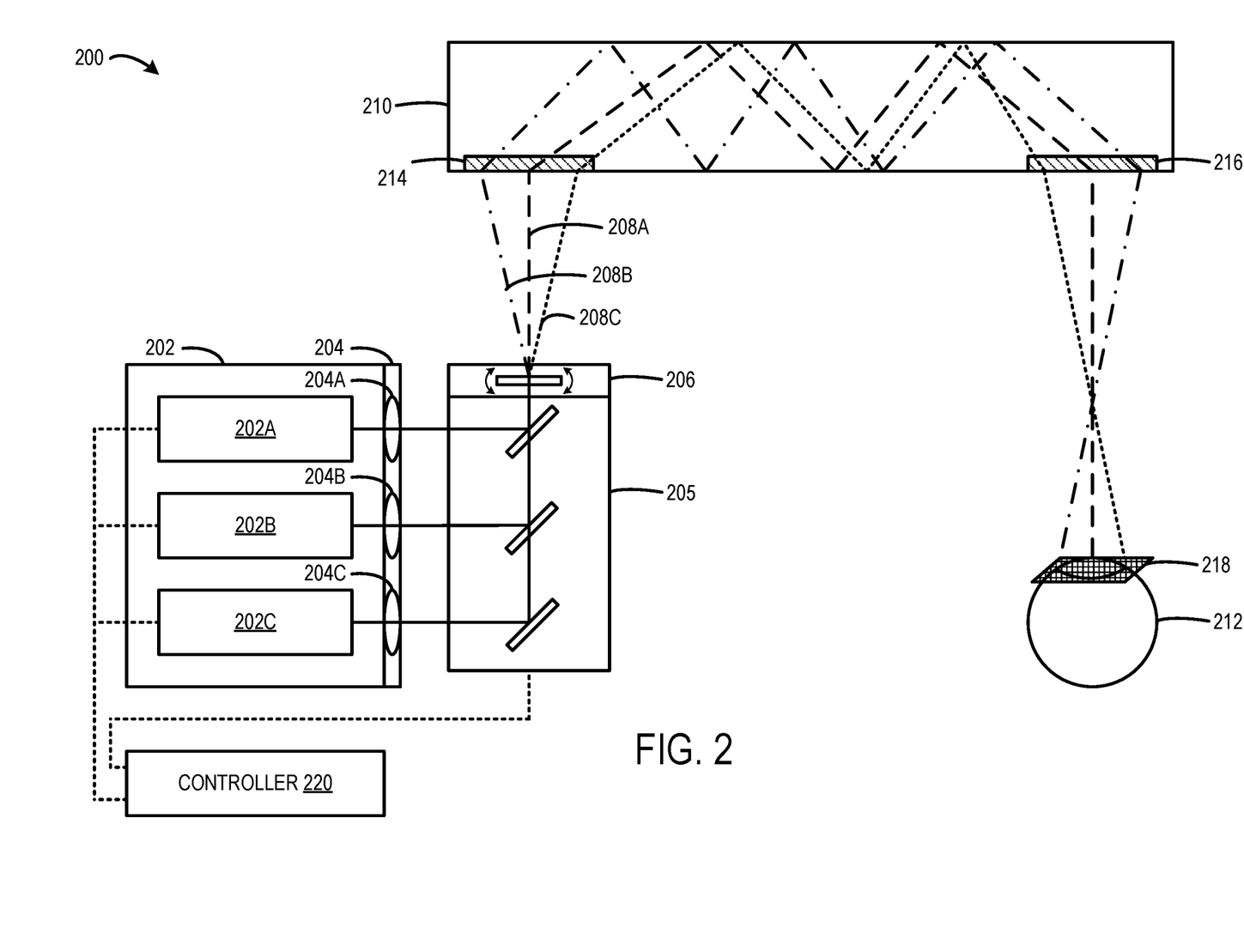
FIG. 2 schematically shows an example near-eye display system.

FIG. 2 schematically shows an example near-eye display system 200 that uses a laser assembly 202 as an illumination source. The laser assembly 202 includes lasers 202A (e.g., a red laser), 202B (e.g., a green laser), and 202C (e.g., a blue laser). Although only three lasers are shown, it will be appreciated that the laser assembly 202 may include any suitable number of lasers. For example, the laser assembly 202 may include 0, 1, 2, 3, or more than 3 red lasers; 0, 1, 2, 3, or more than 3 green lasers; 0, 1, 2, 3, or more than 3 blue lasers; and 0, 1, 2, 3 or more than 3 lasers of other colors. Any combination or modification in the number of lasers may also be available (e.g., 2 red, 2 green, 2 blue, or 1 red, 1 green, 2 blue, etc.). Accordingly, any number of lasers may be used to irradiate/illuminate pixels for generating image content.

In some instances (though not all), the laser assembly 202 also includes a collimating lens assembly 204 (or other diffractive optical element) that is structured to direct light to another location or otherwise operate on the light in some manner. In this example, each of the lasers 202A, 202B, and 202C has a corresponding collimating lens 204A, 204B, 204C. In some implementations, however, a single collimating lens may be used for more than one laser.

The near-eye display 200 includes combination optics 205 configured to spatially combine the light beams lased from the plurality of lasers 202A, 202B, and 202C into a single light beam.

The near-eye display 200 includes a micro-electro-mechanical mirror system (MEMs) 206, though the principles disclosed herein are applicable to any type of laser-based display unit and not only to architectures with the MEMs 206. The MEMs 206 is configured to collect laser light from the combination optics 205, which combines light lased from three different sources (i.e. the lasers 202A, 202B, and 202C) into a single light beam. Additionally, the MEMs 206 is configured to direct laser light 208A (which, in this example includes red laser light, green laser light, and blue laser light) to a waveguide 210. Furthermore, the MEMs 206 is configured to redirect its mirrors/mirror array so that the laser light 208A is aimed at different locations at the waveguide 210. As shown, laser lights 208B and 208C are aimed at different locations on the waveguide 210. In this manner, the MEMs 206 is able to route light to different locations by adjusting the aim of its corresponding mirror array. It will be appreciated that the laser lights 208A-C may be modulated to include varying degrees or intensities (or even an absence of any one or more) of red, green, blue, or other color laser light.

The waveguide 210 is configured to redirect or propagate the laser light 208A-C to a desired location which is viewable by a user's eye 212. It will be appreciated that waveguide 210 may be any type of waveguide display (e.g., a surface relief grating waveguide).

The laser light 208A-C enters the waveguide 210 via an entry grating 214. The laser light 208A-C then propagates (e.g., via total internal reflection) through the waveguide 210 until it reaches an exit grating 216. It will be appreciated that the angles with which the laser light 208A-C enters the waveguide 210 are preserved as the laser light 208A-C propagates through the waveguide 210. This condition is shown by the different angles that each of the respective laser lights 208A-C propagate through the waveguide 210. By configuring the entry grating 214 and the exit grating 216 to meet certain design parameters, the MEMs 206 is able to use waveguide 210 to propagate light towards the user's eye 212.

The laser assembly 202 and the MEMs 206 may be controlled by a controller 220. The controller 220 may be configured to control the MEMs 206, in conjunction with the laser assembly 202 to progressively scan a set of pixels 218 to a target display area for a user's eye 212 to view (e.g., by adjusting the mirror array so that the combined RGB laser beam or light is aimed at different locations) individual pixels of that image in such a rapid manner that the entirety of the image appears before the user's eye 212 without the user realizing that the image was progressively scanned pixel by pixel and line by line. In this way, the near-eye display system 200 may project or render image content for a user to view.

The MEMs 206 may be able to scan an image (i.e., pixels of that image) at any image resolution or range of image resolutions (e.g., in cases where foveated rendering is used). For example, in some implementations, the MEMs 206 is configured to scan RGB light from the laser assembly 202 with a resolution of 2,000 pixels by 1,200 pixels, or any other resolution.

Figure 3:
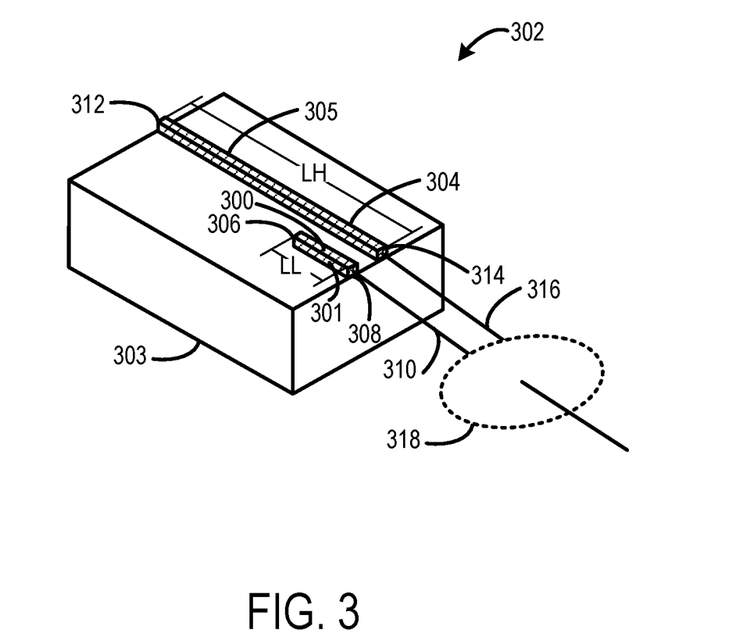
FIG. 3 schematically shows an example multi-stripe edge-emitting laser including a lower power optical cavity and a higher power optical cavity.

FIG. 3 schematically shows an example laser assembly 302 including multiple optical cavities having different lengths and different threshold currents for lasing coherent light. The laser assembly 302 may be representative of any of the lasers 202A, 202B, 202C included in the near-eye display system 200 shown in FIG. 2.

The laser assembly 302 includes a lower power optical cavity 300 positioned on a substrate 303. The lower power optical cavity 300 includes an active gain section 301 that occupies an entirety of the lower power optical cavity 300. The laser assembly 302 further includes a higher power optical cavity 304 adjacent the lower power optical cavity 300 on the substrate 303. The higher power optical cavity 304 includes an active gain section 305 that occupies an entirety of the higher power optical cavity 304. In some examples, the lower power optical cavity 300 and the higher power optical cavity 304 are parallel to each other. In some examples, the substrate may include two adjacent substrates. In some examples, more than two optical cavities may be located on the same substrate.

The active gain sections 301, 305 of the optical cavities 300, 304 are the sources of optical gain within the laser assembly 302. The active gain sections 301, 305 are configured to amplify an optical power of light reflecting within the corresponding optical cavity 300, 304. The gain/amplification results from the stimulated emission of electronic or molecular transitions of an active gain medium of the active gain sections of the optical cavities 300, 304 to a lower energy state from a higher energy state previously populated by a pump source. Laser pumping of the active gain sections of the optical cavities 300, 304 may be performed using different pump sources, such as electrical currents or light generated by discharge lamps or by other lasers, for example. In one particular example, the active gain sections of the optical cavities 300, 304 are configured as reflective semiconductor optical amplifiers (RSOAs).

The lower power optical cavity includes a first reflective end 306 and a second reflective end 308. The two reflective ends 306 and 308 may allow coherent light to reflect back and forth within the lower power optical cavity. Each time a light beam passes through the active gain section, the optical power of the light beam may be amplified. The second reflective end 308 may be partially transparent to allow coherent light 310 to be output from the lower power optical cavity 300.

Similarly, the higher power optical cavity includes a first reflective end 312 and a second reflective end 314. The two reflective ends 312 and 314 may allow coherent light to reflect back and forth within the higher power optical cavity. Each time a light beam passes through the active gain section, the optical power of the light beam may be amplified. In some examples, the second reflective end 314 may be partially transparent to allow coherent light 316 to be output from the higher power optical cavity 300.

In some implementations, the laser assembly 302 optionally may include a light combiner 318 configured to direct coherent light output from the lower power optical cavity 300 and/or the higher power optical cavity 304 along the same optical path. In some examples, the light combiner 318 may be integrated into the laser assembly 302. In other examples, the light combiner 318 may include free-space optics. In yet other examples, the coherent light output from either the lower power optical cavity 300 or the higher power optical cavity 304 may not be combined. For example, different coherent light beams output from the different optical cavities may be selectively reflected by the MEMs 206 based on the image that is being displayed to the user's eye.

A threshold current and power consumption of the optical cavities may be determined mainly by a length of the active gain section in each of the optical cavities 300, 304. Further, the threshold currents may vary as a function of temperature. The lower power optical cavity 300 may have an active gain section length (LL). The higher power optical cavity 304 may have an active gain section length (LH) that is greater than the length (LL) of the active gain section of the lower power optical cavity 300. The lengths (LL) and (LH) may be determined based on the laser requirement for the particular application. As one non-limiting example, the length (LL) of the lower power optical cavity's active gain section is 30 μm and the length of the higher power optical cavity's active gain section is 300 μm. The length (LL) of the lower power optical cavity's active gain section and the length (LH) of the higher power optical cavity's active gain section may be any suitable length.

The laser assembly 302 may be controlled such that the lower power optical cavity 300 is responsible for lasing light for low luminance display content that is near or below a threshold luminance of the higher power optical cavity 304. The higher power optical cavity may be controlled to lase light for higher luminance display content, such as display content having a luminance that is higher than the output capability of the lower power optical cavity 300. Selectively using the lower power optical cavity 300 and/or the high power optical cavity 304 for different pixel luminance levels extends DR and reduces sensitivity to threshold current uncertainty.

There are various instances in which, due to the wave properties of laser light, fringe interference can occur based on coherent light output from a laser assembly propagating through a waveguide (e.g., waveguide 210 shown in FIG. 2). In order to reduce fringe interference that create artifacts in an image output from the waveguide, in some implementations, a laser assembly may be particularly designed with one or more optical cavities each having a total length that is tuned to ensure that optical path lengths (OPLs) supported by the waveguide do not match coherence OPLs of coherent light output from the laser assembly. For example, increasing the optical cavity length to larger than a maximum OPL supported by the waveguide guarantees avoiding all fringe interference.

Figure 4:
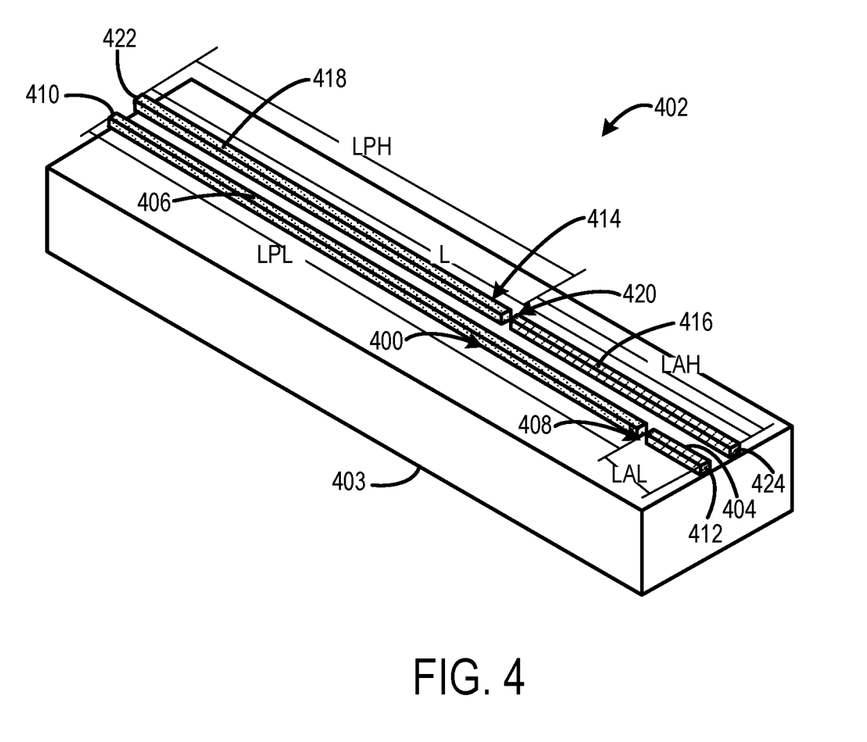
FIG. 4 schematically shows another example multi-stripe edge-emitting laser including a lower power optical cavity and a higher power optical cavity.

Increasing an optical cavity in a manner that increases the length of the active gain section causes an increase in the laser threshold current, and hence the power consumption of the laser. To both reduce/avoid fringe interference and keep laser power consumption low, lower power and higher power optical cavities 400, 414 may be configured to each have two sections—an active gain section 404, 416 and a passive section 406, 418. FIG. 4 schematically shows an example laser assembly 402 including a higher power optical cavity and a lower power optical cavity with each of the optical cavities including two-sections that are tuned to both reduce fringe interference from a corresponding waveguide and extend a DR of the laser assembly. The laser assembly 402 may be representative of any of the lasers 202A, 202B, 202C included in the near-eye display system 200 shown in FIG. 2. Continuing with this example, the laser assembly 402 may be particularly configured to reduce fringe interference caused by the waveguide 210 shown in FIG. 2.

The laser assembly 402 includes a lower power optical cavity 400 positioned on a substrate 403. The lower power optical cavity 400 includes an active gain section 404 and a passive section 406. The active gain section 404 may be optically coupled to the passive section 406 via a transmissive interface 408. In the depicted example, the active gain section 404 is edge coupled to the passive section 406 via the transmissive interface 408. The transmissive interface 408 may be any suitable interface between the two sections of the lower power optical cavity 400 that supports low coupling loss. It will be appreciated that the active gain section 404 may be optically coupled to the passive section 406 in any suitable manner.

The passive section 406 increases a functional length of the optical cavity 400 without further amplifying the optical power of the light reflecting within the lower power optical cavity 400. In some implementations, the passive section 406 is substantially transparent to the light reflecting within the lower power optical cavity 400.

The passive section 406 includes a reflective end 410 and the active gain section 404 includes a reflective end 412. The two reflective ends 410 and 412 may allow coherent light to reflect back and forth within the lower power optical cavity 400. Each time a light beam passes through the active gain section 404, the optical power of the light beam may be amplified. In some examples, the reflective end 412 may be partially transparent to allow coherent light to be output from the lower power optical cavity 400. In other examples, the reflective end 410 may be partially transparent to allow coherent light to be output from the lower power optical cavity 400.

The laser assembly 402 includes a higher power optical cavity 414 positioned on the substrate 403 adjacent the lower power optical cavity 400. In some examples, the substrate may include two adjacent substrates. In some examples, more than two optical cavities may be located on the same substrate. In some examples, the lower power optical cavity 400 and the higher power optical cavity 414 are parallel to each other. The higher power optical cavity 414 includes an active gain section 416 and a passive section 418. The active gain section 416 may be optically coupled to the passive section 418 via a transmissive interface 420. The passive section 418 increases a functional length of the higher power optical cavity 414 without further amplifying the optical power of the light reflecting within the higher power optical cavity 414. In some implementations, the passive section 418 is substantially transparent to the light reflecting within the higher power optical cavity 414.

The passive section 406 includes a reflective end 422 and the active gain section 416 includes a reflective end 424. The two reflective ends 422 and 424 may allow coherent light to reflect back and forth within the higher power optical cavity 414. Each time a light beam passes through the active gain section 416, the optical power of the light beam may be amplified. In some examples, the reflective end 424 may be partially transparent to allow coherent light to be output from the higher power optical cavity 414. In other examples, the reflective end 422 may be partially transparent to allow coherent light to be output from the higher power optical cavity 414.

The lower power optical cavity 400 and the higher power optical cavity 414 have a same overall length (L). The overall length (L) satisfies the fringe mitigation requirements of the waveguide. The threshold currents (and the power consumption) of each of the optical cavities 400, 414 is determined mainly by a length of the active gain sections 404 and 416. The length (LAL) of the active gain section 404 of the lower power optical cavity 400 may be less than the length (LAH) of the active gain section 416 of the higher power optical cavity 414. Since the optical cavities 400, 414 have the same overall length, the length (LPL) of the passive section 406 of the lower power optical cavity 400 is greater than the length (LPH) of the passive section 418 of the higher power optical cavity 414. The lengths (LAL), (LAH) of the active gain sections 404, 416, the lengths (LPL), (LHL) of the passive section 406, 418, and/or the overall length (L) of the optical cavities 400, 414 may be any suitable length. In some examples, the higher power optical cavity may not include a passive section and the active gain section may fill the higher power optical cavity.

Figure 5:
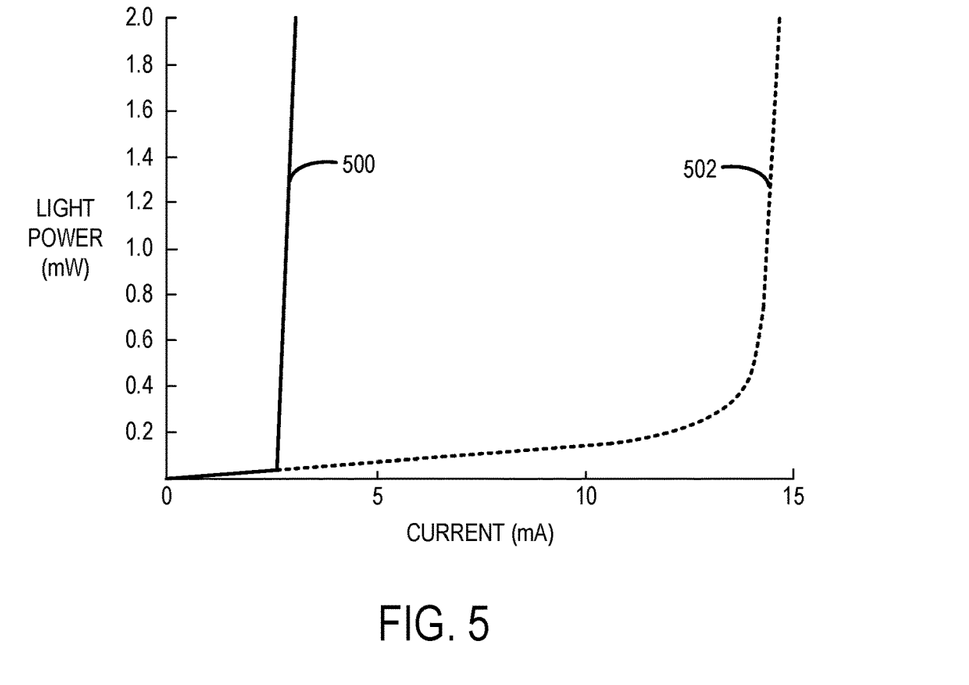
FIG. 5 shows a graph representing L-I curves for a lower power optical cavity and a higher power optical cavity of a multi-stripe edge-emitting laser.

FIG. 5 shows a graph depicting example light power responses to excitation current for each of a lower power optical cavity and a higher power optical cavity of a multi-stripe edge-emitting laser, such as the laser assemblies 202, 302, 402 shown in FIGS. 2, 3, and 4. A light power response curve 500 of the lower power optical cavity has a steep slope and a low threshold current (e.g., ~2 mA). A light power response curve 502 of the higher power optical cavity initially has a shallow response curve until the excitation current reaches the higher power optical cavity's threshold current (e.g., ~14 mA) at which point the light power response curve 502 becomes steeper. Since the lower power optical cavity has a much quicker light power response at lower currents, the lower power optical cavity may be used to provide coherent light for lower luminance content in an image. Further, the higher power optical cavity may be used to provide coherent light for higher luminance content in an image.

Figure 6:
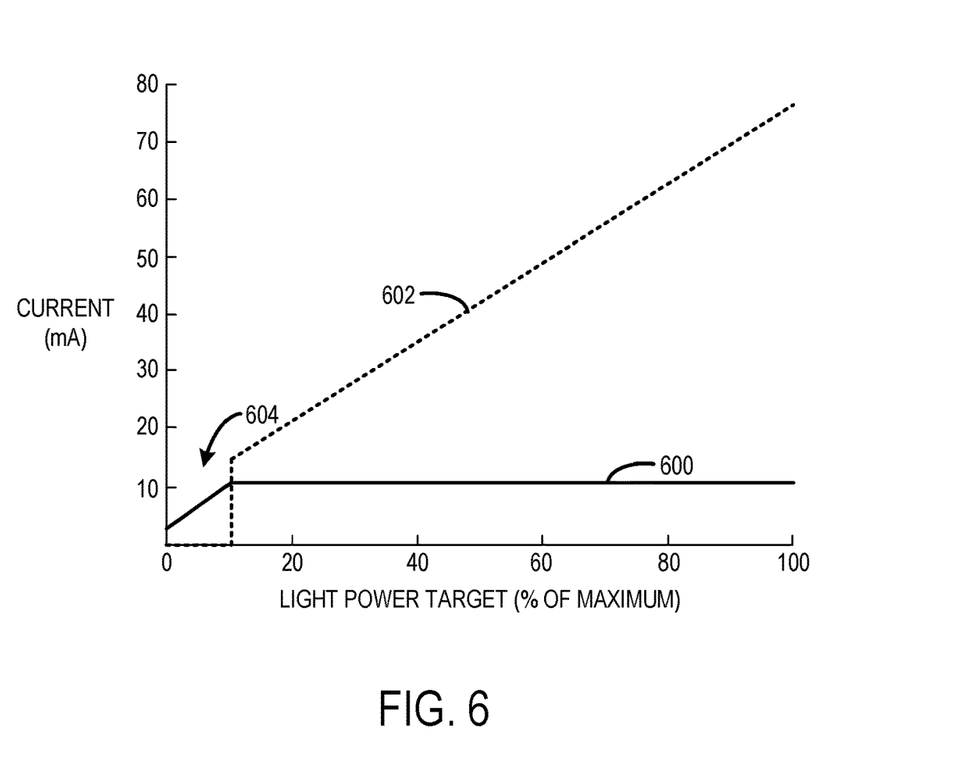
FIG. 6 shows a graph representing a current drive scheme for a lower power optical cavity and a higher power optical cavity of a multi-stripe edge-emitting laser.

FIG. 6 shows a graph depicting an example drive scheme for controlling a lower power optical cavity and a higher power optical cavity of a multi-stripe edge-emitting laser, such as the laser assemblies 202, 302, and 402 shown in FIGS. 2, 3, and 4. For example, the drive scheme may be employed by the controller 220 shown in FIG. 2 to control the laser assembly 202. In the graph, an excitation current for the lower power optical cavity is shown at 600. An excitation current for the higher power optical cavity is shown at 602. According to the example drive scheme, an excitation current is applied to the lower power optical cavity to output a response when an optical power or light power target is less than the threshold current (e.g., ~14 mA) of the higher power optical cavity in a low luminance region 604. When the optical power or light power target is in the region 604, excitation current is not applied to the higher power optical cavity. When a light power target is greater than the threshold current of the higher power optical cavity, an excitation current is applied to the higher power optical cavity to output a response to the light power target. In the depicted example, an excitation current is applied to the lower power optical cavity even when the higher power optical cavity is providing a light power response. In other examples, the lower power optical cavity may be turned off or excitation current applied to the lower power optical cavity may be lowered when the higher power optical cavity is providing the light power response. Selectively using either or both of the optical cavities for different pixel luminance levels extends DR and reduces sensitivity to threshold current uncertainty because the power required for lower luminance pixels can be well above the threshold current for the lower power optical cavity, while the higher power optical cavity can achieve relatively high optical power.

Note that in some implementations, the controller 220 may be configured to control a laser having three, four, or more optical cavities with different lengths of active gain sections. The controller 220 may be configured to control the plurality of optical cavities based on a plurality of different thresholds, such that the progressively longer active gain sections may be excited to provide a desired optical power.

Figure 7:
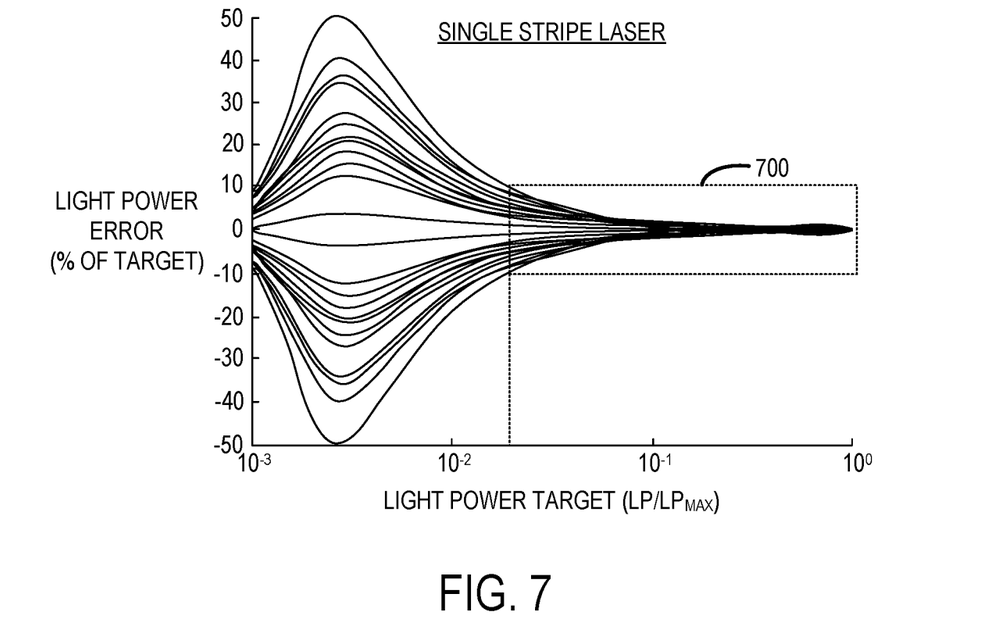
FIG. 7 shows a graph representing a light power error versus a light power target for a single stripe edge-emitting laser.
Figure 8:
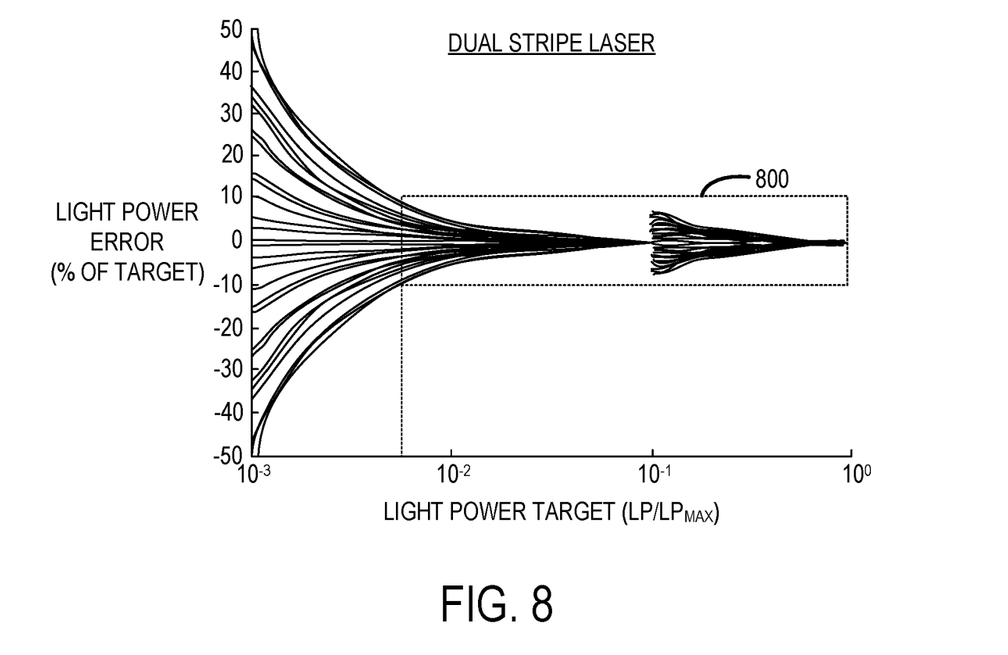
FIG. 8 shows a graph representing a light power error versus a light power target for a multi-stripe edge-emitting laser.

FIG. 7 show a graph of a light power error level relative to a light power target for an example single stripe laser. Error box 700 shows the light power target range in which the single stipe laser maintains an error less than or equal to +/−10%. FIG. 8 shows a corresponding graph of a light power error level relative to a light power target for an example dual-stripe laser, such as the laser assemblies 202, 302, and 402 shown in FIGS. 2, 3, and 4. Error box 800 shows the light power target range in which the dual-stripe laser maintains an error less than or equal to +/−10%. As can be seen, error box 700 covers a smaller range than error box 800. In particular, when operating at a smaller percentage of total light power, the dual-stripe laser demonstrates a lower error level than the single stripe laser.

Figure 9:
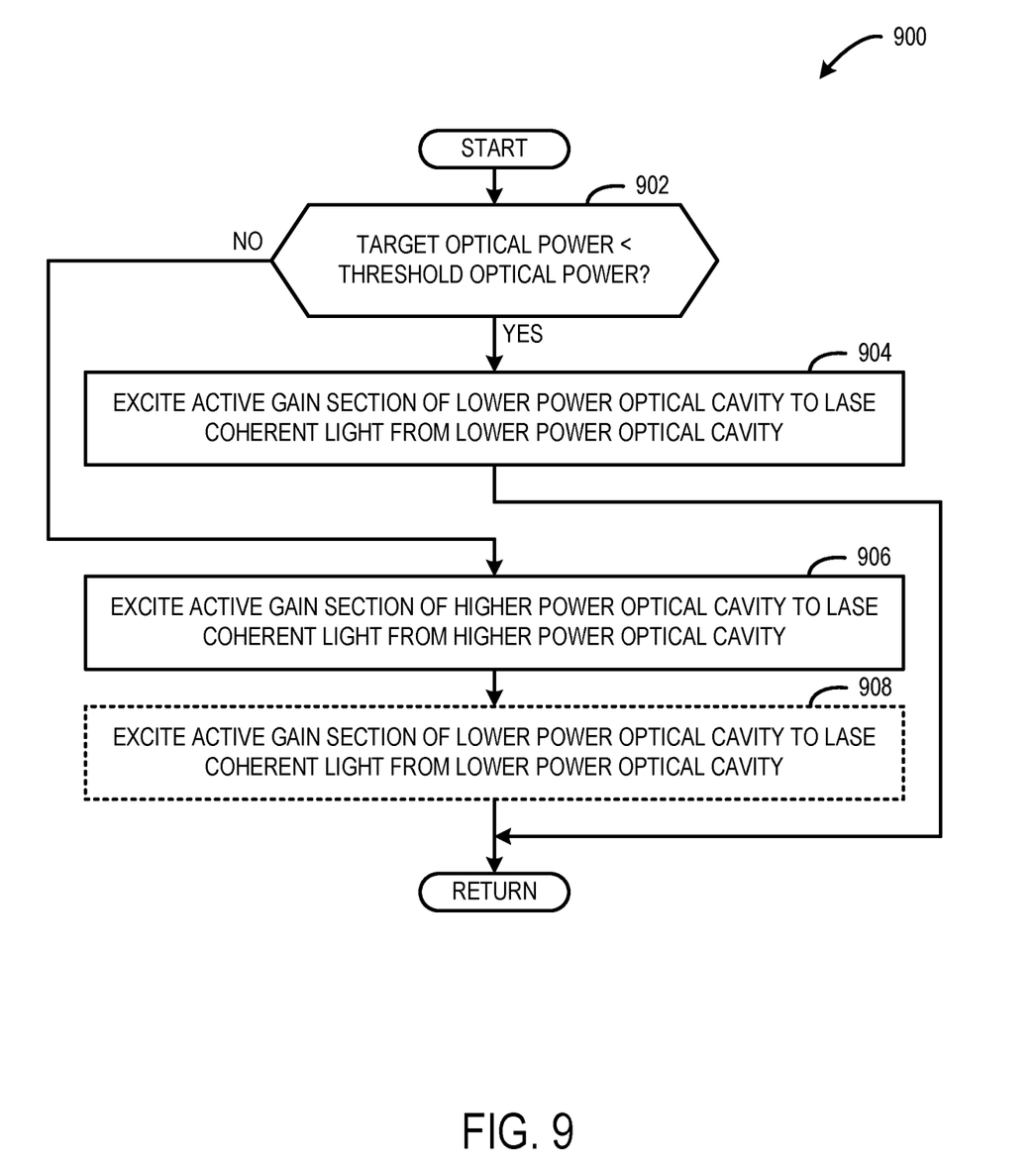
FIG. 9 shows a method for controlling a multi-stripe edge-emitting laser.

FIG. 9 shows an example method 900 for operating a multi-stripe edge-emitting laser, such as the laser assemblies 202, 302, and 402 shown in FIGS. 2, 3, and 4. For example, the method 900 may be performed by the near-eye display system 100 shown in FIG. 1, and/or the controller 220 shown in FIG. 2. At 902, the method includes determining whether or not a target optical power is greater than a threshold optical power. The target optical power may be based on an image to be displayed (e.g., color channel brightness for a pixel) and corresponds to a desired output power of coherent light. As one example, the threshold optical power is derived from a lasing threshold at which the higher power optical cavity lases coherent light. The lasing threshold may vary as a function of a temperature of the higher power optical cavity. As another example, the threshold optical power corresponds to a peak/maximum optical power of the lower power optical cavity. The threshold optical power may be set at any suitable optical power. If the target optical power is less than the threshold optical power, then the method 900 moves to 904. Otherwise, the method 900 moves to 906.

At 904, the method 900 includes exciting a first active gain section of the lower power optical cavity to lase coherent light from the lower power optical cavity based on the target optical power being less than an optical power threshold. In this case, the lower power optical cavity may be used to meet the target optical power requirement with low error. Note that the higher power optical cavity does not output coherent light to meet the target optical power based on the target optical power being less than the threshold optical power.

At 906, the method 900 includes exciting a second active gain section of the higher power optical cavity to lase coherent light from the higher power optical cavity based on the target optical power being greater than the optical power threshold. In this case, the higher power optical cavity may be used to meet the target optical power requirement. Even though the higher power optical cavity achieves a higher peak optical power than may be possible with the lower power optical cavity, the error remains low because the higher power optical cavity is not near its threshold current at which the laser lases coherent light.

At 908, the method 900 optionally may include exciting the first active gain section to lase coherent light from the lower power optical cavity based on the target optical power being greater than the optical power threshold. In some cases, both optical cavities may be excited to meet the target optical power requirement. In some other cases, the lower power optical cavity may be turned off or the excitation current may be reduced based on the target optical power being greater than the threshold optical power.

While method 900 is described with respect to controlling a dual-stripe laser, the method may be extended to controlling a laser having three, four, or more optical cavities with different lengths of active gain sections. A plurality of different thresholds may be established, and progressively longer active gain sections may be excited based on a desired optical power.

Figure 10:
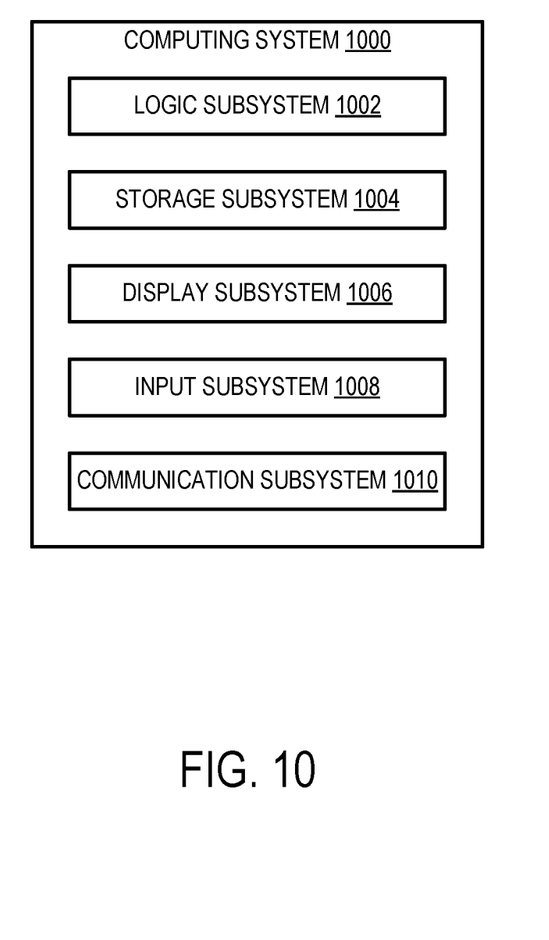
FIG. 10 schematically shows an example computing system.

FIG. 10 schematically shows a simplified representation of a computing system 1000 configured to provide any to all of the compute functionality described herein. Computing system 1000 may take the form of one or more head-mounted, near-eye display devices, personal computers, network-accessible server computers, tablet computers, home-entertainment computers, gaming devices, mobile computing devices, mobile communication devices (e.g., smart phone), virtual/augmented/mixed reality computing devices, wearable computing devices, Internet of Things (IoT) devices, embedded computing devices, and/or other computing devices. For example, computing system 1000 may be representative of the head-mounted electronic device 102 in FIG. 1.

Computing system 1000 includes a logic subsystem 1002 and a storage subsystem 1004. Computing system 1000 may optionally include a display subsystem 1006, input subsystem 1008, communication subsystem 1010, and/or other subsystems not shown in FIG. 10.

Logic subsystem 1002 includes one or more physical devices configured to execute instructions. For example, the logic subsystem 1002 may be configured to execute instructions that are part of one or more applications, services, or other logical constructs. The logic subsystem 1002 may include one or more hardware processors configured to execute software instructions. Additionally or alternatively, the logic subsystem 1002 may include one or more hardware or firmware devices configured to execute hardware or firmware instructions. Processors of the logic subsystem 1002 may be single-core or multi-core, and the instructions executed thereon may be configured for sequential, parallel, and/or distributed processing. Individual components of the logic subsystem 1002 optionally may be distributed among two or more separate devices, which may be remotely located and/or configured for coordinated processing. Aspects of the logic subsystem 1002 may be virtualized and executed by remotely-accessible, networked computing devices configured in a cloud-computing configuration.

Storage subsystem 1004 includes one or more physical devices configured to temporarily and/or permanently hold computer information such as data and instructions executable by the logic subsystem 1002. When the storage subsystem 1004 includes two or more devices, the devices may be collocated and/or remotely located. Storage subsystem 1004 may include volatile, nonvolatile, dynamic, static, read/write, read-only, random-access, sequential-access, location-addressable, file-addressable, and/or content-addressable devices. Storage subsystem 1004 may include removable and/or built-in devices. When the logic subsystem 1002 executes instructions, the state of storage subsystem 1004 may be transformed—e.g., to hold different data.

Aspects of logic subsystem 1002 and storage subsystem 1004 may be integrated together into one or more hardware-logic components. Such hardware-logic components may include program- and application-specific integrated circuits (PASIC/ASICs), program- and application-specific standard products (PSSP/ASSPs), system-on-a-chip (SOC), and complex programmable logic devices (CPLDs), for example.

The logic subsystem 1002 and the storage subsystem 1004 may cooperate to instantiate one or more logic machines. As used herein, the term "machine" is used to collectively refer to the combination of hardware, firmware, software, instructions, and/or any other components cooperating to provide computer functionality. In other words, "machines" are never abstract ideas and always have a tangible form. A machine may be instantiated by a single computing device, or a machine may include two or more sub-components instantiated by two or more different computing devices. In some implementations a machine includes a local component (e.g., software application executed by a computer processor) cooperating with a remote component (e.g., cloud computing service provided by a network of server computers). The software and/or other instructions that give a particular machine its functionality may optionally be saved as one or more unexecuted modules on one or more suitable storage devices. As examples, the logic subsystem 1002 and the storage subsystem 1004 may be implemented as a controller, such as controller 220 shown in FIG. 2.

When included, display subsystem 1006 may be used to present a visual representation of data held by storage subsystem 1004. This visual representation may take the form of a graphical user interface (GUI). Display subsystem 1006 may include one or more display devices utilizing virtually any type of technology. In some implementations, display subsystem may include one or more virtual-, augmented-, or mixed reality displays. As an example, display subsystem 1006 may be implemented as the near-eye display system 100 shown in FIG. 1 and/or the near-eye display system 200 shown in FIG. 2.

When included, input subsystem 1008 may comprise or interface with one or more input devices. An input device may include a sensor device or a user input device. Examples of user input devices include a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition.

When included, communication subsystem 1010 may be configured to communicatively couple computing system 1000 with one or more other computing devices. Communication subsystem 1010 may include wired and/or wireless communication devices compatible with one or more different communication protocols. The communication subsystem 1010 may be configured for communication via personal-, local- and/or wide-area networks.

In an example, an edge-emitting laser comprises a substrate, a lower power optical cavity located on the substrate, the lower power optical cavity including a first active gain section having a first length, and a higher power optical cavity located on the substrate adjacent the lower power optical cavity, the higher power optical cavity including a second active gain section having a second length greater than the first length. In this example and/or other examples, the edge-emitting laser may further comprise a controller configured to excite the first active gain section to lase coherent light from the lower power optical cavity based on a target optical power being less than an optical power threshold, and excite the second active gain section to lase coherent light from the higher power optical cavity based on the target optical power being greater than the optical power threshold. In this example and/or other examples, the controller may be configured to excite the first active gain section to lase coherent light from the lower power optical cavity without exciting the second active gain section based on the target optical power being less than the optical power threshold. In this example and/or other examples, the controller may be configured to excite the first active gain section to lase coherent light from the lower power optical cavity based on the target optical power being greater than the optical power threshold. In this example and/or other examples, the optical power threshold may be derived from a lasing threshold at which the higher power optical cavity lases coherent light. In this example and/or other examples, the optical power threshold may vary as a function of a temperature of the higher power optical cavity. In this example and/or other examples, the edge emitting laser may further comprise an optical combiner configured to receive either or both of coherent light lased by the lower power optical cavity and coherent light lased by the higher power optical cavity, and direct the coherent light lased by the lower power optical cavity and coherent light lased by the higher power optical cavity to a same optical output path. In this example and/or other examples, the lower power optical cavity may have a first length and the higher power optical cavity may have a second length greater than the first length. In this example and/or other examples, the edge-emitting laser may be configured to lase coherent light into a waveguide, and a length of the lower power optical cavity and a length of the higher power optical cavity may be tuned to avoid fringe interference due to coherent light propagating through the waveguide. In this example and/or other examples, the lower power optical cavity may have a first passive section that increases a functional length of the lower power optical cavity without further amplifying the optical power of light reflecting within the lower power optical cavity. In this example and/or other examples, the lower power optical cavity and the higher power optical cavity may have a same length.

In an example, an edge-emitting laser comprises a substrate, a lower power optical cavity located on the substrate, the lower power optical cavity including a first active gain section having a first length, a higher power optical cavity located on the substrate adjacent the lower power optical cavity, the higher power optical cavity including a second active gain section having a second length greater than the first length, and a controller configured to excite the first active gain section to lase coherent light from the lower power optical cavity based on a target optical power being less than an optical power threshold, and excite the second active gain section to lase coherent light from the higher power optical cavity based on the target optical power being greater than the optical power threshold. In this example and/or other examples, the controller may be configured to excite the first active gain section to lase coherent light from the lower power optical cavity without exciting the second active gain section based on the target optical power being less than the optical power threshold. In this example and/or other examples, the controller may be configured to excite the first active gain section to lase coherent light from the lower power optical cavity based on the target optical power being greater than the optical power threshold. In this example and/or other examples, the optical power threshold may be derived from a lasing threshold at which the higher power optical cavity lases coherent light. In this example and/or other examples, the minimum threshold current may vary as a function of a temperature of the higher power optical cavity.

In an example, a method for operating a multi-stripe edge-emitting laser including a lower power optical cavity located on a substrate and a higher power optical cavity located on the substrate adjacent the lower power optical cavity comprises exciting a first active gain section of the lower power optical cavity to lase coherent light from the lower power optical cavity based on a target optical power being less than an optical power threshold, and exciting a second active gain section of the higher power optical cavity to lase coherent light from the higher power optical cavity based on the target optical power being greater than the optical power threshold. In this example and/or other examples, the first active gain section may be excited to lase coherent light from the lower power optical cavity without exciting the second active gain section based on the target optical power being less than the optical power threshold. In this example and/or other examples, the method may further comprise exciting the first active gain section to lase coherent light from the lower power optical cavity based on the target optical power being greater than the optical power threshold. In this example and/or other examples, the optical power threshold may be derived from a lasing threshold at which the higher power optical cavity lases coherent light.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. An edge-emitting laser, comprising:
a substrate;
a lower power optical cavity located on the substrate, the lower power optical cavity including a first active gain section having a first length; and
a higher power optical cavity located on the substrate adjacent the lower power optical cavity, the higher power optical cavity including a second active gain section having a second length greater than the first length, wherein the edge-emitting laser is configured to lase coherent light into a waveguide, and wherein a length of the lower power optical cavity and a length of the higher power optical cavity are tuned to avoid fringe interference due to coherent light propagating through the waveguide.

2. The edge-emitting laser of claim 1, further comprising a controller configured to excite the first active gain section to lase coherent light from the lower power optical cavity based on a target optical power being less than an optical power threshold, and excite the second active gain section to lase coherent light from the higher power optical cavity based on the target optical power being greater than the optical power threshold.

3. The edge-emitting laser of claim 2, wherein the controller is configured to excite the first active gain section to lase coherent light from the lower power optical cavity without exciting the second active gain section based on the target optical power being less than the optical power threshold.

4. The edge-emitting laser of claim 2, wherein the controller is configured to excite the first active gain section to lase coherent light from the lower power optical cavity based on the target optical power being greater than the optical power threshold.

5. The edge-emitting laser of claim 2, wherein the optical power threshold is derived from a lasing threshold at which the higher power optical cavity lases coherent light.

6. The edge-emitting laser of claim 5, wherein the optical power threshold varies as a function of a temperature of the higher power optical cavity.

7. The edge emitting laser of claim 1, further comprising an optical combiner configured to receive either or both of coherent light lased by the lower power optical cavity and coherent light lased by the higher power optical cavity, and direct the coherent light lased by the lower power optical cavity and coherent light lased by the higher power optical cavity to a same optical output path.

8. The edge-emitting laser of claim 1, wherein the lower power optical cavity has a first length and the higher power optical cavity has a second length greater than the first length.

9. The edge-emitting laser of claim 1, wherein the lower power optical cavity has a first passive section that increases a functional length of the lower power optical cavity without further amplifying the optical power of light reflecting within the lower power optical cavity.

10. The edge-emitting laser of claim 1, wherein the lower power optical cavity and the higher power optical cavity have a same length.

11. An edge-emitting laser, comprising:
a substrate;
a lower power optical cavity located on the substrate, the lower power optical cavity including a first active gain section having a first length;
a higher power optical cavity located on the substrate adjacent the lower power optical cavity, the higher power optical cavity including a second active gain section having a second length greater than the first length; and
a controller configured to excite the first active gain section to lase coherent light from the lower power optical cavity based on a target optical power being less than an optical power threshold, and excite the first active gain section to lase coherent light from the lower power optical cavity and excite the second active gain section to lase coherent light from the higher power optical cavity based on the target optical power being greater than the optical power threshold.

12. The edge-emitting laser of claim 11, wherein the controller is configured to excite the first active gain section to lase coherent light from the lower power optical cavity without exciting the second active gain section based on the target optical power being less than the optical power threshold.

13. The edge-emitting laser of claim 11, wherein the optical power threshold is derived from a lasing threshold at which the higher power optical cavity lases coherent light.

14. The edge-emitting laser of claim 13, wherein the minimum threshold current varies as a function of a temperature of the higher power optical cavity.

15. A method for operating a multi-stripe edge-emitting laser including a lower power optical cavity located on a substrate and a higher power optical cavity located on the substrate adjacent the lower power optical cavity, the method comprising:
exciting a first active gain section of the lower power optical cavity to lase coherent light from the lower power optical cavity based on a target optical power being less than an optical power threshold; and
based on the target optical power being greater than the optical power threshold, exciting the first active gain section to lase coherent light from the lower power optical cavity and exciting a second active gain section of the higher power optical cavity to lase coherent light from the higher power optical cavity.

16. The method of claim 15, wherein the first active gain section is excited to lase coherent light from the lower power optical cavity without exciting the second active gain section based on the target optical power being less than the optical power threshold.

17. The method of claim 15, wherein the optical power threshold is derived from a lasing threshold at which the higher power optical cavity lases coherent light.

* * * * *